United States Patent [19]
Shapiro

[11] 3,963,931
[45] June 15, 1976

[54] X-RAY TUBE CURRENT MONITOR

[75] Inventor: Jonathan Salem Shapiro, Greenwich, Conn.

[73] Assignee: The Machlett Laboratories, Incorporated, Stamford, Conn.

[22] Filed: Apr. 10, 1975

[21] Appl. No.: 566,890

[52] U.S. Cl............................. 250/416 R; 250/551; 324/96
[51] Int. Cl.² ................. G01R 31/00; G02B 27/00; H05G 1/30
[58] Field of Search .............. 250/416, 551; 324/96

[56] References Cited
UNITED STATES PATENTS

| | | | |
|---|---|---|---|
| 1,307,645 | 6/1919 | Waite | 250/416 |
| 2,038,277 | 1/1935 | Gent | 324/96 |
| 3,346,811 | 10/1967 | Perry et al. | 324/96 |
| 3,488,586 | 1/1970 | Watrous et al. | 324/96 |
| 3,772,514 | 11/1973 | Sunderland | 250/551 |

*Primary Examiner*—Alfred E. Smith
*Assistant Examiner*—T. N. Grigsby
*Attorney, Agent, or Firm*—John T. Meaney; Joseph D. Pannone; Harold A. Murphy

[57] ABSTRACT

X-Ray tube monitoring apparatus comprising a shockproof housing having insulatingly disposed therein for electrical connection between the anode of an X-ray tube and a high voltage source a current sensing means which is operatively connected to opto-electronic means for transmitting a linearized light output signal corresponding to an anode current passing through the sensing means safely out of the shockproof housing to a relatively low voltage amplifying and display means.

10 Claims, 1 Drawing Figure

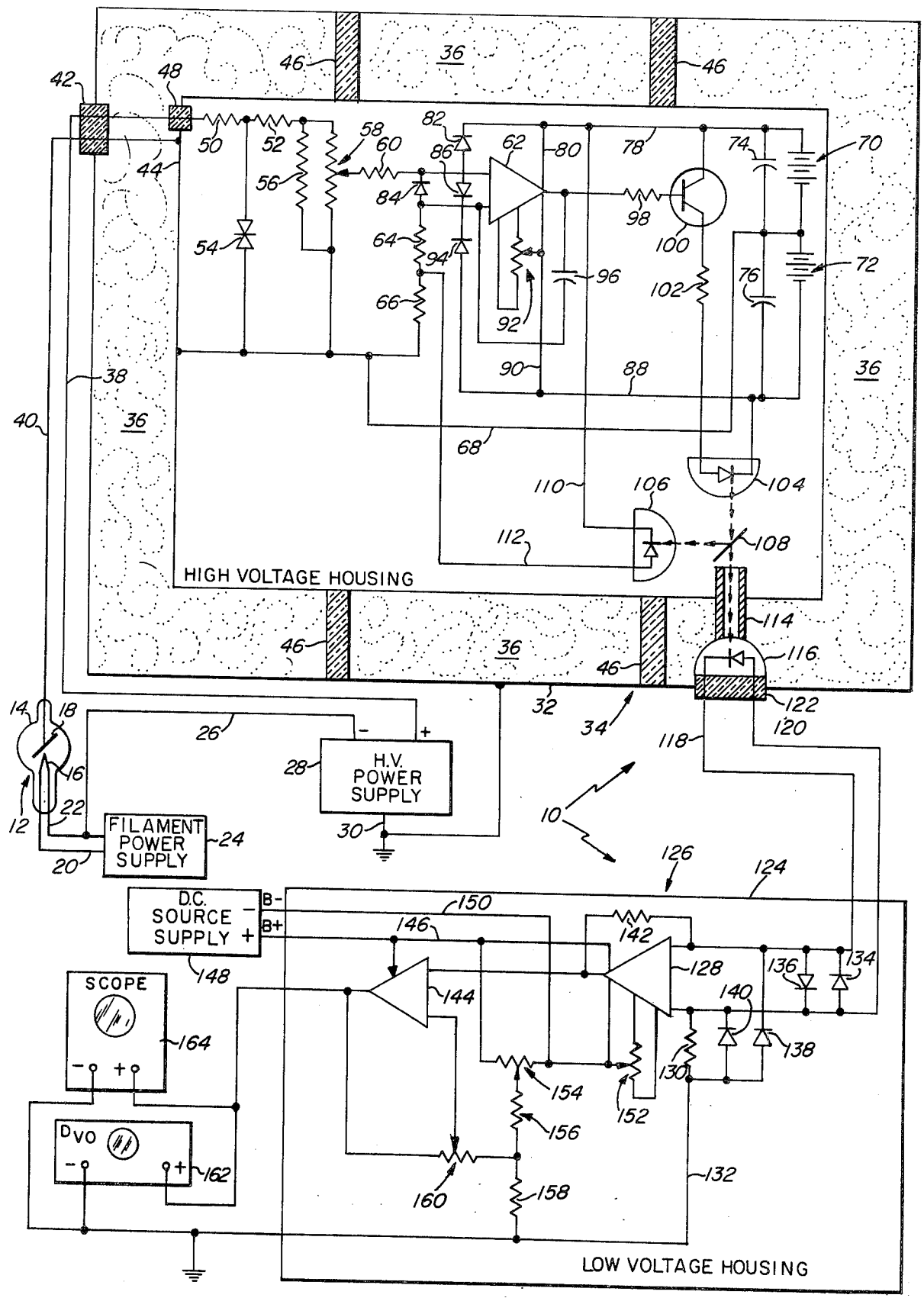

X-RAY TUBE CURRENT MONITOR

BACKGROUND OF THE INVENTION

This invention relates generally to X-ray tube monitoring systems and is concerned more particularly with apparatus for safely measuring the current in a high voltage anode circuit of an X-ray tube.

In the operation of a conventional X-ray tube, the cathode and anode target electrodes generally are maintained at suitable electrical potentials, such as a negative and a positive seventy-five kilovolts relative to ground, respectively, for example, to establish a strong electrostatic field therebetween. As a result, electrons emitted from the cathode are beamed electrostatically onto the anode target with sufficient energy to generate X-rays. Thus, the beamed electrons impinging on the anode target represent an anode current which flows from an external high voltage source through a connecting circuit to the anode target of the X-ray tube.

In order to measure the anode current, a current measuring means, such as a meter, for example, generally is connected in the anode circuit between the high voltage source and the X-ray tube. However, this places the current measuring meter at the high voltage level of the anode target. Consequently, the current measuring meter usually is enclosed within a shockproof housing in order to ensure the safety of personnel operating the equipment. Thus, the current measurements are not available for remote viewing by conventional low voltage means, such as an oscilloscope or a digital meter, for examples.

Furthermore, the current measuring meter generally is of the movable coil type having a response time which provides an average of the anode current over the measurement time interval. However, if the anode current waveform were displayed on an oscilloscope, instantaneous variations in the anode current could be seen. Also, the anode current waveform may disclose X-ray tube defects, cable leakage, stray capacitance, and the like.

Therefore, it is advantageous and desirable to provide X-ray tube monitoring apparatus with means for safely transmitting measurements of anode current from the high voltage levels of the anode circuit to an isolated readout device at relatively low voltage levels.

SUMMARY OF THE INVENTION

Accordingly, this invention provides X-ray tube monitoring apparatus comprising a shockproof housing having insulatingly disposed therein for electrical connection between an X-ray tube anode and a high voltage source a current sensing means for producing an electrical signal corresponding to an anode current passing through it. The current sensing means is electrically connected through signal amplifying means to a light emitting device which is optically coupled to first and second light responsive means. The light emitting device produces a nonlinear light output signal proportionate to the amplified signal received from the current sensing means.

The first light responsive means receives a portion of the light output energy produced by the light emitting device and produces a negative feedback signal for the signal amplifying means. This negative feedback signal modifies the output of the signal amplifying means such that the light emitting device produces a linearized light output signal corresponding to the anode current passing through the current sensing means.

The second light responsive means also receives a portion of the light output energy produced by the light emitting device and, consequently, produces an electrical signal corresponding to the linearized light output signal produced by the light emitting device. This signal is conducted out of the shockproof housing to a low voltage amplifying circuit means which produces an amplified electrical signal corresponding to the anode current passing through the current sensing means. Connected to the output of the low voltage amplifying circuit means may be suitable display and indicating means, such as an oscilloscope and a digital voltmeter, for examples, whereby the anode current may be examined and evaluated.

Thus, the current sensing means, the light emitting device, and the second light responsive means serve to optically isolate the high voltage anode circuit from the low voltage amplifying circuit means while transmitting a signal corresponding to the anode current in a manner which ensures the safety of personnel operating the apparatus.

BRIEF DESCRIPTION OF THE DRAWING

For a better understanding of this invention, the following more detailed description makes reference to the accompanying drawing wherein:

FIG. 1 is a schematic view of an X-ray tube monitoring apparatus which embodies the invention.

DESCRIPTION OF THE PREFERRED EMBODIMENT

Referring to the drawing, there is shown in FIG. 1 an X-ray tube monitoring apparatus 10 for measuring the anode current of an X-ray tube, such as 12, for example. X-ray tube 12 comprises an evacuated envelope 14 wherein an electron emitting cathode 16 is operatively disposed to direct a beam of electrons onto a spaced anode target 18 and thereby generate X-rays which radiate therefrom. The cathode 16 is electrically connected, as by conductive leads 20 and 22, respectively, for example, to an external filament power supply 24 which provides electrical current for heating the cathode to electron emitting temperatures.

The cathode 16 also is connected externally of tube 12, as by conductive leads 22 and 26, for example, to a negative terminal of a high voltage, direct current power supply 28, which has a terminal lead 30 connected to electrical ground. Thus, the cathode 16 is maintained at a substantial negative potential, such as seventy-five kilovolts, for example, with respect to electrical ground. The grounded terminal lead 30 of high voltage power supply 28 is connected electrically to a hollow metal housing 32 of a high voltage unit 34, whereby the housing 32 is maintained at electrical ground. Housing 32 may have any convenient configuration, such as cylindrical, for example, and is filled with a dielectric fluid 36, such as sulfur hexafluoride ($SF_6$) gas, for example, to insulate it from high voltage components therein. A positive terminal of high voltage power supply 28 and the anode target 18 of tube 12 are connected to respective conductors 38 and 40 which pass insulatingly, as by means of hermetically sealed connector 42, for example, into the housing 32 of high voltage unit 34.

Within housing 32, the conductor 40 is connected directly to a hollow metal casing 44 whereby the casing 44 is maintained at a substantial positive potential, such as 75 kilovolts, for example, with respect to the electrically grounded housing 32. Casing 44 may have any convenient configuration, such as cylindrical, for example, and is insulatingly supported, as by dielectric spacers 46, for example, in a shockproof manner within housing 32. The casing 44, preferably is not hermetically sealed in order to allow the dielectric fluid 36 to enter casing 44 and insulate high voltage components therein. Conductor 38 passes insulatingly, as by means of dielectric bushing 48, for example, into casing 44. Thus, the electrons beamed from cathode 16 onto anode target 18 to generate X-rays represent an anode current which in the practice of this invention, is measured within the shockproof housing 32.

Within the casing 44, conductor 38 is connected to a resistor 50 which is connected in series with another resistor 52. The junction of series resistors 50 and 52, respectively, is connected electrically through a transient suppressor device 54 to the casing 44. The resistor 52 is connected to a current sensing resistor 56 of relatively low ohmic value, such as one ohm, for example, which is connected to the casing 44 and the anode target 18 of X-ray tube 12. Thus, the anode current, which may be between two milliamperes and two amperes, for example, flows through the current sensing resistor 56 and produces a corresponding voltage drop across it.

A portion of the voltage drop developed across resistor 56 may be selected by means of a gain control potentiometer 58, the resistive element of which is connected in parallel with the resistor 56. The movable wiper arm of potentiometer 58 is connected through an input resistor 60 to the positive input terminal of an operational amplifier 62. The negative input terminal of amplifier 62 is connected through a pair of series resistors, 64 and 66, respectively, to the casing 44. Thus, the proportionate value of voltage drop across resistor 56 selected by the movable wiper arm of potentiometer 58 is impressed across the respective input terminals of operational amplifier 62. As a result, the amplifier 62 produces an amplified output signal indicative of the anode current passing through the current sensing resistor 56.

Casing 44 also is connected through a conductor 68 to a junction of two series connected sources of DC voltage, such as batteries 70 and 72, for example. The batteries 70 and 72 are connected in voltage additive relationship, and are connected in parallel with filter bypass capacitors 74 and 76, respectively. The positive terminal of battery 70 is connected through a conductor 78 and a conductive lead 80 to the positive Vcc terminal of operational amplifier 62. The conductor 78 also is electrically connected through a reverse-biased, clamping diode 82 to the positive input terminal of amplifier 62 whereby the voltage applied thereto is prevented from exceeding a predetermined positive value, such as fifteen volts, for example, with respect to casing 44. A pair of oppositely oriented clamping diodes, 84 and 86, respectively, are connected in parallel between the input terminals of amplifier 62 to limit the impressed input voltage drop to a predetermined value, such as seven-tenths of a volt, for example.

The negative terminal of battery 72 is connected through a conductor 88 and a conductive lead 90 to the minus Vcc terminal of amplifier 62. The conductive lead 90 also is connected to the wiper arm of a zero adjustment potentiometer 92 which has a resistive element connected between appropriate respective terminals of the amplifier 62. The conductor 88 also is connected through a reverse-biased, clamping diode 94 to the negative input terminal of amplifier 62 whereby the voltage applied thereto is prevented from exceeding a predetermined negative value, such as fifteen volts, for example, with respect to casing 44. The negative input terminal of amplifier 62 is connected electrically to the output terminal thereof through a frequency compensating capacitor 96 which prevents "overshoot" in the output signal produced by amplifier 62.

The output signal from amplifier 62 is applied through a current limiting resistor 98 to the base of a current amplifying transistor 100, thereby rendering it conductive to drive a light emitting diode (LED) 102. The collector of transistor 100 is connected through conductor 78 to the positive terminal of battery 70; and the emitter is connected through a current limiting resistor 102 to the anode of LED 104. The cathode of LED 102 is connected through conductor 88 to the negative terminal of battery 72. Thus, when transistor 100 is rendered conductive, current flows through the LED 102 and causes it to emit a beam of light.

However, since the quantum response of a light emitting diode with respect to input current is inherently nonlinear, the intensity of the light output signal produced by the LED 102 is not linear with respect to the current input signal from transistor 100. On the other hand, a reverse-biased photodiode has a converse characteristic of producing an output current signal which is linear with respect to an input light signal. Accordingly, this invention provides a feedback photodiode 106 for sampling the light output signal from the LED 102 and generating a corresponding current signal which is fed back to the operational amplifier 62. The feedback diode 106 is optically coupled to the output of the LED 102 by suitable means, such as half-silvered mirror 108, for example. Mirror 108 is disposed in the path of the light beam emanating from the LED 102 and oriented at a suitable angle thereto for directing a portion of the light beam onto the feedback photodiode 106.

In order to reverse bias photodiode 106, the cathode thereof is connected through a conductive lead 110 and conductor 78 to the positive terminal of battery 70. The anode of photodiode 106 is connected through a conductive lead 112 to the junction of series resistors 64 and 66, respectively, and through resistor 66 and conductor 68 to the negative terminal of battery 70. Consequently, when the photodiode 106 receives a sample portion of the light output signal from the LED 102, it produces a corresponding output current signal which flows through resistor 66 to the battery 70. As a result, the input voltage at the negative terminal of amplifier 62 is modified accordingly thereby balancing the positive input voltage signal from the wiper arm of potentiometer 58. Thus, the anode current passing through the sensing resistor 56 controls the output signal produced by amplifier 62 and the resulting conductivity of transistor 100. Accordingly, the output of LED 102 is linearized, and the intensity of its light output signal is directly proportional to the anode current passing through resistor 56.

Most of the linearized light output signal produced by the LED 102 passes through mirror 108 and a light conduit means 114, such as a plastic encased clad glass rod, for example, to a transmitting photodiode 116. The cathode and anode of photodiode 116 are connected to respective conductors 118 and 120, which pass through a hermetically sealed connector 122 in housing 32 and enter a housing 124 of a low voltage receiver unit 126. In housing 124, the conductors 118 and 120 are connected to respective positive and negative input terminals of an operational amplifier 128. The negative input terminal of amplifier 128 is connected through a gain control resistor 130 and a connecting conductor 132 to an external terminal which is connected to electrical ground. Accordingly, when the linearized light output signal from the LED 102 is incident on the transmitting photodiode 116, it generates a corresponding current output signal which is conducted into housing 124 to the input terminals of amplifier 128. Thus, the light conduit member 114 and the transmitting photodiode 116 constitute means for isolating the high voltage components in housing 32 from the low voltage circuitry in housing 124, and for insulatingly transmitting a signal therebetween.

Within housing 124, the amplifier 128 may have oppositely oriented clamping diodes, 134 and 136, respectively, connected in parallel across its input terminals to limit the input signal to a predetermined value. Also, the positive and negative input terminals of amplifier 128 may be electrically connected to conductor 132 and electrical ground through transient protective, clamping diodes 138 and 140, respectively. The positive input terminal of amplifier 128 may be connected through a feedback resistive element 142 to the output of amplifier 128 which, in turn, is connected to the positive input terminal of a second operational amplifier 144. The respective +Vcc terminals of amplifiers 128 and 144 are connected through a conductor 146 to the positive terminal of an external DC voltage source 148.

The negative terminal of DC voltage source 148 is connected through a conductor 150 to the wiper arm of a zero adjustment potentiometer 152, the resistive element of which is connected between respective appropriate terminals of amplifier 128. Conductor 150 also is connected through the resistive element of another zero adjustment potentiometer 154 to the conductor 146 and the positive terminal of the DC voltage source 148. The wiper arm of potentiometer 154 is connected through a voltage divider comprising series resistors 156 and 158, respectively, to electrical ground. Connected to the junction of resistors 156 and 158 is the resistive element of a gain control potentiometer 160 which has a wiper arm connected to the negative input terminal of amplifier 144. The resistive element of gain control potentiometer 160 also is connected to the output of amplifier 144 which is connected externally of housing 124 to positive terminals of suitable indicating and display means, such as digital voltmeter 162 and oscilloscope 164, for examples.

Thus, the signal received from transmitting photodiode 116 is amplified in two stages by operational amplifiers 128 and 144, respectively, to produce an amplified signal which is suitable for viewing an oscilloscope 164 and for activating a numerical indication on voltmeter 162. The amplified output signal, thus produced, is directly proportional to the anode current passing through the current sensing resistor 56 in the gas-filled housing 32 of high voltage unit 34. The signal is conveyed to low voltage circuitry in unit 126 for display and numerical indication in a manner which ensures the safety of personnel and accuracy of the current measurement.

Thus, there has been disclosed herein a novel X-ray tube monitoring apparatus for accurately measuring the anode current in a high voltage circuit and transmitting it to a low voltage circuit means for indication and display purposes. Although the LED 102 has been shown optically coupled to the feedback photodiode 106 and the transmitting photodiode 116 through a half-silvered mirror 108 and an optically aligned light pipe 114, it also may be coupled thereto by other means, such as bifurcated fiber optic bundle having a common end directed toward the LED 102 and respective other ends directed toward the photodiodes 106 and 116, respectively, for example.

From the foregoing, it will be apparent that all of the objectives of this invention have been achieved by the structures and circuits shown and described. It also will be apparent, however, that various changes may be made by those skilled in the art without departing from the spirit of the invention as expressed in the appended claims. It is to be understood, therefore, that all matter shown and described herein is to be interpreted as illustrative and not in a limiting sense.

What is claimed is:

1. An X-ray tube monitoring apparatus comprising:
   current sensing means disposed for electrical connection between an electrode of an X-ray tube and a direct current source for producing an electrical output signal indicative of a unidirectional current flowing through the tube;
   opto-electronic isolating means coupled to the current sensing means for transmitting the signal therefrom in an electrically insulating manner to a respective output terminal of the isolating means; and
   instantaneous display means electrically connected to the output terminals of the opto-electronic isolating means for indicating instantaneous changes in the value of a current flowing through the X-ray tube.

2. An X-ray tube monitoring apparatus as set forth in claim 1 wherein the opto-electronic isolating means includes first opto-electronic circuit means electrically connected to the current sensing means for converting the electrical output signal therefrom into a corresponding light output signal.

3. An X-ray tube monitoring apparatus as set forth in claim 2 wherein the opto-electronic isolating means includes second opto-electronic circuit means optically coupled to the output of the first opto-electronic circuit means for converting the light output signal therefrom into a corresponding electrical output signal and applying it to a respective output terminal thereof.

4. An X-ray tube monitoring apparatus as set forth in claim 2 wherein the first opto-electronic circuit means includes conductive gating means operatively connected to the current sensing means for permitting a current flow therethrough in response to a signal from the current sensing means.

5. An X-ray tube monitoring apparatus as set forth in claim 4 wherein the first opto-electronic circuit means includes a light emitting device and a voltage source connected to one another through the conductive gating means.

6. An X-ray tube monitoring apparatus as set forth in claim 5 wherein the first opto-electronic circuit means includes signal linearizing feedback means optically coupled to the output of the light emitting device for regulating the output of the light emitting device in accordance with variation in the signal produced by the current sensing means.

7. An X-ray tube monitoring apparatus as set forth in claim 6 wherein the signal linearizing means includes first light responsive means optically coupled to the output of the light emitting device for sampling the output light signal of the device and converting it to a corresponding electrical signal.

8. An X-ray tube monitoring apparatus as set forth in claim 7 wherein the signal linearizing means includes differential amplifying means electrically connected to the current sensing means and the light responsive means for comparing the output signals therefrom and producing a differential output electrical signal, the output of the differential amplifying means being electrically connected to the gating means.

9. An X-ray tube monitoring apparatus as set forth in claim 3 wherein the second opto-electronic circuit means includes a second light responsive device optically coupled to the output of the light emitting device for receiving the light output signal therefrom and producing a corresponding electrical output signal.

10. An X-ray tube monitoring apparatus as set forth in claim 9 wherein the second opto-electronic circuit means includes amplifying means electrically connected to the output of the second light responsive device for enhancing the electrical output signal therefrom and applying it to the respective output terminal of the second opto-electronic circuit means.

* * * * *